United States Patent [19]
McCalpin et al.

[11] Patent Number: 5,710,519
[45] Date of Patent: Jan. 20, 1998

[54] CIRCUIT FOR AUTOMATICALLY BIASING RF POWER TRANSISTOR BY USE OF ON-CHIP TEMPERATURE-SENSING TRANSISTOR

[75] Inventors: William H. McCalpin, Sunnyvale, Calif.; Donald K. Belcher, Rogersville, Tenn.; David S. Piazza, Santa Clara; Pierre R. Irissou, Sunnyvale, both of Calif.

[73] Assignee: Spectrian, Sunnyvale, Calif.

[21] Appl. No.: 623,961

[22] Filed: Mar. 29, 1996

[51] Int. Cl.$^6$ .............. G05F 1/10; H01L 35/00; H03K 17/60

[52] U.S. Cl. .......... 327/538; 327/513; 327/480; 327/482

[58] Field of Search ............ 327/512, 513, 327/362, 478, 482, 489–492, 538, 479–481, 577, 578

[56] References Cited

U.S. PATENT DOCUMENTS

| | | | |
|---|---|---|---|
| 3,566,200 | 2/1971 | Seidler | 327/483 |
| 3,831,040 | 8/1974 | Nanba et al. | 327/512 |
| 3,955,108 | 5/1976 | Beck | 327/513 |
| 4,004,462 | 1/1977 | Dobkin | 327/512 |
| 4,204,133 | 5/1980 | Ahmed | 327/512 |
| 4,242,598 | 12/1980 | Johnson et al. | 327/513 |
| 4,684,880 | 8/1987 | Chan | 327/540 |

*Primary Examiner*—Toan Tran
*Attorney, Agent, or Firm*—Charles E. Wands

[57] ABSTRACT

A circuit arrangement automatically sets quiescent collector current conditions for a class A/B RF power transistor, which is configured of a plurality of parallel-connected transistors formed in a common semiconductor die. The biasing circuit arrangement includes a temperature-sensing transistor having its collector-emitter current flow path coupled with a programmable constant current source. A differential amplifier circuit is coupled to the base and emitter electrodes of the temperature sensing transistor, and generates a bias voltage for biasing each of the transistors of the RF power device. This bias voltage is combined with a programmable D.C. offset voltage. The values of the constant current and D.C. offset voltage are programmed such that the average of the quiescent collector currents of the parallel-connected transistors of the RF power transistor corresponds to the quiescent collector current through the temperature-sensing transistor. An optional external control voltage may be used to further adjust the bias voltage for the RF power transistor.

35 Claims, 2 Drawing Sheets

CIRCUIT FOR AUTOMATICALLY BIASING RF POWER TRANSISTOR BY USE OF ON-CHIP TEMPERATURE-SENSING TRANSISTOR

FIELD OF THE INVENTION

The present invention relates in general to RF power amplifiers, and is particularly directed to a bias control circuit arrangement, which automatically sets the base-emitter bias conditions so as to establish the quiescent collector current of a class A/B RF power amplifier transistor, the bias control circuit being driven by a temperature sensing transistor which may be resident in the same semiconductor chip as the RF power amplifier transistor.

BACKGROUND OF THE INVENTION

Many of today's communication products, such as those employed for cellular and public communication system (PCS) applications, use RF power amplifiers that are designed to operate in class A/B mode (wherein current is conducted for more than 180 degrees, but less that 360 degrees of a full RF cycle). Class A/B mode is a reasonably good compromise between linearity (optimized by class A operation but degraded for class C operation) and efficiency (optimized by class C operation but degraded for class A operation).

As a non-limiting example, a class A/B RF power amplifier transistor (the semiconductor architecture of which is typically comprised of hundreds of small geometry devices connected in parallel in a single die) may have its bias-defined collector current set at value on the order of twenty-five percent of its maximum value. (During RF conduction, the transistor will become self-biased by the amplitude of the signal to increase the collector current.) To provide this reduced quantity of bias-controlled collector current, it is common practice to use a fixed external voltage source that applies a very linear voltage Vbe across the base-emitter junction of the RF power transistor, and serves to minimize interference with adjacent channels. This fixed base-emitter biasing voltage source is customarily installed on the RF power amplifier printed circuit board/substrate in the immediate vicinity of the RF power transistor package/die.

Because the beta and Vbe of RF power transistors will vary from device to device among different manufacturing lots, it is necessary to measure the response of the transistor to given conditions, in order that the transistor's bias-controlled collector current may be precisely set. This objective is complicated by the fact that using an external mechanism to sense the collector current is not practical, due to the widely varying operating conditions inherent to class A/B operation. Also, since RF power transistors must have their emitters hard-grounded, DC feedback cannot be used.

A further problem is the fact that, when used in a cellular environment, the device can be expected to be subjected to sudden changes. For example, when the drive to an RF power device that has been operating at a high, steady-state power level is suddenly removed (a condition that is often encountered in digital cellular communication systems), the device will not immediately respond to the application of a lower RF power level. Due to the phenomenon of temperature inertia, the bias at the new operating level may be incorrectly set.

SUMMARY OF THE INVENTION

In accordance with first embodiment of the present invention, the above-described problems of conventionally employed biasing schemes for an RF power amplifier transistor operated in class A/B mode are effectively remedied, by usurping a small portion of the myriad of parallel-connected transistors that make up the RF power transistor for temperature-sensing purposes, and controlling the bias to the remaining transistors of the RF power device by means of a bias control circuit that is external to the RF power transistor, and the operation of which is driven in accordance with the temperature-sensing transistor output.

The transistors of the usurped temperature-sensing transistor section of the RF power transistor have their collector electrodes connected to a collector bus in common with the collector electrodes of the remaining transistor sets of which the RF power transistor architecture is comprised. The base electrodes of the temperature-sensing transistor section are connected to a temperature sense base terminal pad, that is separate from an RF input signal terminal pad, to which the base electrodes of the remaining transistor sets are connected in common. Also the emitter electrodes of the temperature-sensing transistor section are connected via an associated emitter degenerate resistor to a separate temperature sense emitter terminal pad. The terminal pads of the temperature-sensing transistor section provide access points by way of which electrical circuit connections (e.g., wire bonds) can be made between an external bias control circuit and the emitter and base electrodes of the temperature sensing transistor section.

The external bias control circuit is preferably configured as an application specific integrated circuit (ASIC) mounted on a circuit board/substrate in proximity to the RF power transistor package/die. The bias control ASIC includes a programmable constant current source and a programmable D.C. offset voltage generator. The programmable constant current source is connected between the emitter pad of the temperature-sensing transistor section and ground, and is operative to force a programmable constant current through the collector-emitter path of the temperature-sensing transistor section.

The programmable constant current source may be implemented as a voltage-to-current converter, which includes a current-setting resistor, and a plurality of programming pads connected through respective fusible links to ground. The size of the current-setting resistor is predefined in accordance with the size of the transistor. The bias current generator produces an analog output current, whose value is defined by applying a prescribed voltage to one or more of the programming pads, thereby rupturing one or more of the fusible links and thus programming the magnitude of the generated bias current.

The programmable D.C. offset voltage generator is employed to inject a programmed D.C. offset voltage into the temperature compensation path from the temperature-sensing transistor section to the RF input signal terminal pad of the RF power transistor. This voltage is equivalent to the IR voltage drop across the emitter-degeneration resistor, and serves to 'fine-tune' effect of the temperature-sensing transistor section, after the RF transistor architecture and the bias control ASIC have been fully characterized. The magnitude of the D.C. offset voltage to be programmed into the ASIC may be determined by measuring the collector current under preliminary quiescent conditions of the RF power transistor and the temperature-sensing transistor section. The average transistor collector current for the entire RF transistor should be the same as the collector current for the temperature-sensing transistor section. Whatever offset voltage is necessary to match these collector currents is then programmed into the offset voltage generator.

To inject the this programmed D.C. offset voltage into the temperature compensation path of the RF power transistor, the output of the D.C. voltage generator may be coupled to an input of differential amplifier circuitry, which is operative to combine various bias control inputs and supply a bias control voltage to the base electrodes of the main power transistor section of the RF power device. The differential amplifier circuitry may include a first differential amplifier having a first input coupled to a temperature sense emitter pad, and a second input coupled to a temperature sense base pad and to a bias voltage source.

Since the first and second inputs of the first differential amplifier are thus coupled to the base-emitter junctions of the transistors of the die-resident temperature-sensing transistor section, the first differential amplifier will sense the base-emitter voltage Vbe of the temperature-sensing transistor section, plus a small value of additional voltage that results from the flow of emitter current through its degenerate emitter resistor. This additional small voltage component corresponds to the product of the temperature-sensing transistor section's emitter current sourced through the degenerate emitter resistor to ground by the constant current source of the bias control ASIC.

To facilitate direct (wire bond) connections between associated terminal pads of the ASIC and the RF power transistor, particularly where the RF power transistor die and the bias control ASIC are mounted on a substrate rather than a circuit board, the respective temperature sense base and emitter pads of the bias control ASIC may be located adjacent to the base and emitter pads of the temperature-sensing transistor section, and the temperature sense base pad of the bias control ASIC may be located adjacent to the base pad of the RF power transistor.

Because the processing conditions for forming all transistors on any given die are the same, all transistors on the die should be geometrically and dopant matched. In order to have each of the transistor sets of the RF power transistor track the temperature-compensated bias provided by the temperature-sensing transistor section, the output of the first differential amplifier can be directly coupled to the output terminal pad of the bias control ASIC for direct wire bond connection to the RF input signal terminal pad to which the base electrodes of the remaining transistors of the RF power transistor are connected in common.

To couple the programmed D.C. offset voltage to the differential amplifier circuitry of the temperature compensation path, the output of the first differential amplifier may be connected to a first input of a second differential amplifier, which has a second input connected to receive the programmed D.C. offset voltage. The output of the second differential amplifier will thus contain both a temperature compensation component and a D.C. offset voltage component and may be directly coupled to the RF input signal terminal pad of the RF power transistor.

To accommodate signal processing applications, where the characteristics of the temperature-sensing transistor section need not correspond precisely with those of the parallel-connected transistors of the RF power transistor, the temperature-compensation device may be incorporated into the ASIC proper, rather than using a portion of the transistors of the RF power transistor die. According to this second embodiment of the invention, the ASIC is configured to include an auxiliary temperature-sensing, diode-connected bipolar transistor having its base and collector electrodes tied in common to an auxiliary base sense pad and its emitter electrode connected to an auxiliary emitter sense pad.

Thus, the resultant bias voltage applied to the RF power transistor will be based upon the behavior of the ASIC-resident device, rather than a die-resident device. In this embodiment, the collector current is primarily established by the D.C. voltage offset, whereas the programmable bias current source is employed to 'fine-tune' the temperature compensation, after the RF transistor and the bias control ASIC have been formed.

A benefit of using such an ASIC-resident device for temperature compensation is the fact that the manufacture of the RF power transistor is simplified. The mask set for the RF power transistor die need not be tailored for and provide separate connections to a temperature-sensing transistor section, and separate wiring steps for the sense base and sense emitter connections between a temperature-sensing transistor section and the ASIC are not required. However, for optimum sensitivity and performance, installing the temperature-sensing device in a dedicated portion of the RF power transistor die in accordance with the first embodiment will ensure that the behavior of the temperature-sensing transistor device will precisely match that of the overall RF power transistor.

In accordance with a further aspect of the invention, the temperature compensation path may be coupled to receive an externally generated control voltage, so as to allow the bias voltage to the RF power transistor to be adjusted in accordance with an externally generated modulation function, such as the envelope of the RF signal of interest, or other control signal, such as a separate DC voltage source. This externally generated bias or modulation control voltage may be applied as a further input to the first differential amplifier, or, where the second differential amplifier is used to inject the programmed D.C. offset voltage into the temperature compensation path, it may be supplied as a further input to the second differential amplifier. Alternatively, the output of the second differential amplifier may be coupled to a first input of a third differential amplifier, which has a second input connected to an external control pad to which a source of external bias or modulation may be applied.

BRIEF DESCRIPTION OF THE DRAWINGS

FIG. 3 is a diagrammatic pictorial illustration of the mounting of an application specific integrated circuit (ASIC) on a substrate in proximity to an RF power transistor die.

DETAILED DESCRIPTION

As described briefly above, the temperature-compensation, bias control mechanism in accordance with a first embodiment of the present invention dedicates a small section of the parallel-connected transistors that make up an RF power transistor architecture for temperature-sensing purposes, and controls the Vbe bias to the remaining transistors of the RF power device by means of a bias control ASIC that is external to the RF power transistor, and the operation of which is driven in accordance with the temperature-sensing transistor section output.

Figure 1:
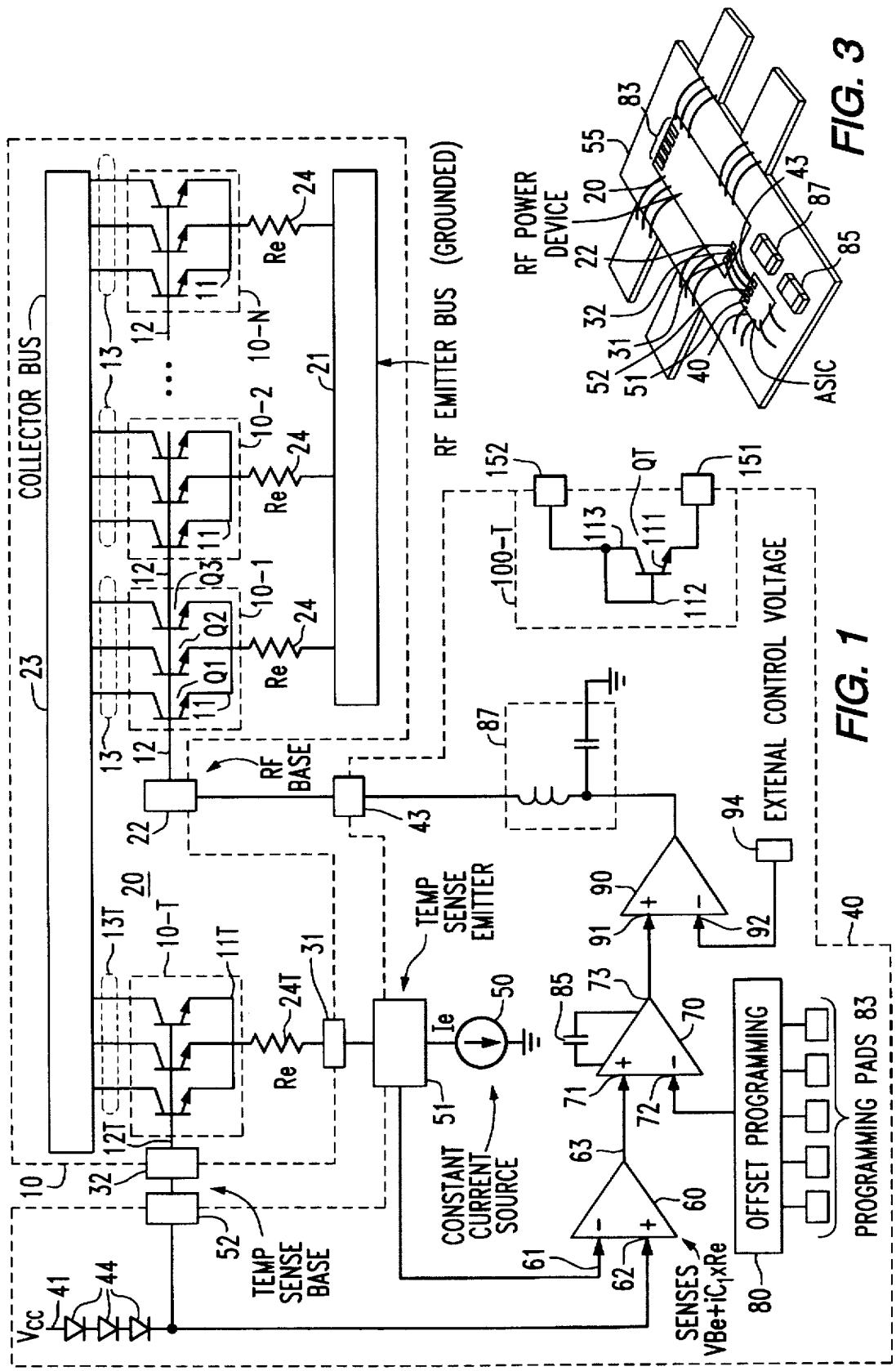
FIG. 1 is a diagrammatic illustration of an RF power transistor coupled with a bias control ASIC in accordance with the present invention.
Figure 2:
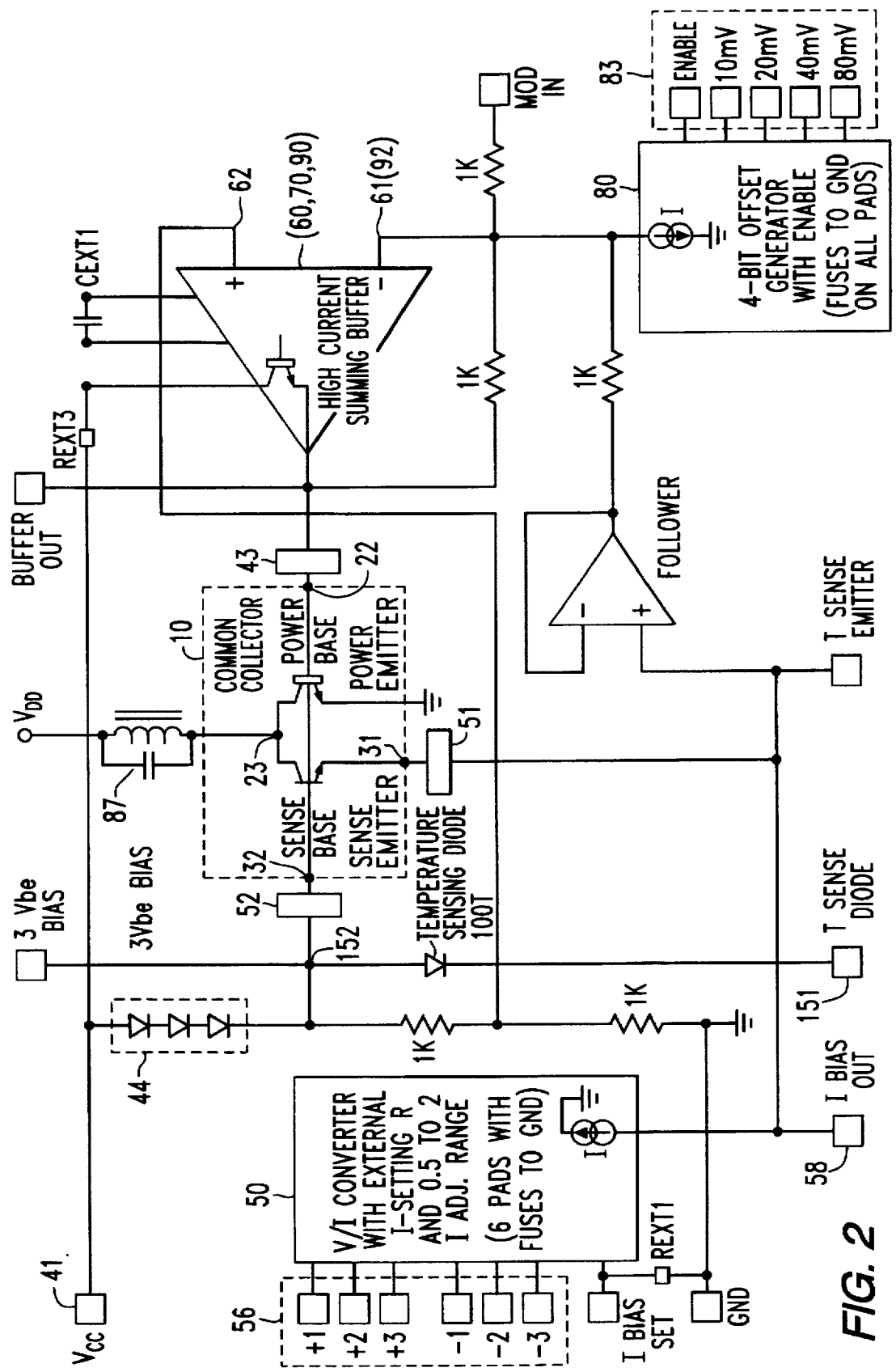
FIG. 2 is a schematic diagram of a practical circuit implementation of the circuit architecture diagrammatically illustrated in FIG. 1.

Referring now to the diagrammatic illustration of FIG. 1 and FIG. 2, which is a schematic diagram of a practical circuit implementation of the circuit architecture of FIG. 1, an RF power transistor that incorporates the temperature-compensation bias control mechanism of the present invention is illustrated as comprising an RF power bipolar transistor 10, the semiconductor architecture of which is formed in a single semiconductor die 20 containing a plurality of sets of transistors 10-1, 10-2, . . . , 10-N. Each set of transistors of these plural sets 10-1, . . . , 10-N, in turn, includes a prescribed number of transistors, such as three parallel transistors (illustrated as Q1, Q2, Q3) per set, as a non-limiting example, having their respective emitter electrodes 11, base electrodes 12 and collector electrodes 13 respectively connected in parallel to an emitter bus 21, an RF signal base terminal pad 22, and a collector bus 23.

As is customary practice in the manufacture an RF power bipolar transistor, in order to ensure proper operation and distribute the amplified signal across all of the transistors of the RF power transistor die, emitter-degenerate resistors 24 are connected between emitters 11 and a grounded emitter bus 21. Because of the parallel connection of the emitters, the overall resistance is an extremely low value (on the order of only fractions of an ohm), which effectively provides a 'hard' connection from the emitter electrodes 11 to the grounded emitter bus 21.

Pursuant to the first embodiment of the invention, the transistors of an additional one of the total number of sets of transistors resident in the die 20, shown as a transistor set or section 10-T, has collector electrodes 13T connected to collector bus 23 in common with the collector electrodes 13 of the remaining transistor sets 11 of the RF power transistor architecture. The base electrodes 12T of the temperature-sensing transistor section 10-T are connected to a temperature sense base terminal pad 32, that is separate from an RF input signal terminal pad 22 to which the base electrodes 12 of the remaining transistor sets 11 are connected in common. Also the emitter electrodes 11T of the temperature-sensing transistor section 10-T are connected via an associated emitter degenerate resistor 24T to a separate temperature sense emitter terminal pad 31.

The terminal pads 31 and 32 provide die access points by way of which electrical circuit connections (e.g., wire bonds) can be made between an external bias control circuit, surrounded by broken lines 40, and the emitter and base electrodes 11T and 12T, respectively of the temperature sensing transistor set 10-T. The output of the external bias control circuit 40 is provided at terminal pad 43, for connection to the RF signal base terminal pad 22 of RF power bipolar transistor 10.

As described briefly above, the external bias control circuit 40 is preferably configured as an application specific integrated circuit (ASIC) and, as diagrammatically illustrated in the pictorial illustration of FIG. 3, may be mounted on a substrate 55 in proximity to RF power transistor 10. ASIC 40 includes a programmable constant current source 50, which is connected between a temperature sense emitter pad 51 and ground. Programmable constant current source 50 is operative to force the flow of a programmable constant current Ie through the collector-emitter path of the temperature sense transistor 10T, so that its collector current Ic may be set at a programmable constant value (varying only by the ratio of beta/(beta+1).

As schematically illustrated in FIG. 2, programmable constant current source 50 may be implemented as a voltage-to-current converter, which includes an internal current-setting resistor, and a plurality of programming pads 56 connected through respective fusible links to ground. The size of the current-setting resistor is predefined in accordance with the size of the RF power transistor 10. Programmable bias current generator 50 produces an analog output current at output current pad 58, whose value is defined by applying a prescribed voltage to one or more of the programming pads 56, thereby rupturing one or more of the fusible links and thus programming the magnitude of the generated bias current. As a non-limiting example, the output current may be varied over an adjustment range of 0.5 to 2.0.

To facilitate direct (wire bond) connections between associated terminal pads of the ASIC and the RF power transistor, particularly where the RF power transistor die and the bias control ASIC are mounted on a substrate rather than a circuit board, the respective temperature sense emitter and base pads 51 and 52 of the bias control ASIC may be located adjacent to the emitter and base pads 31 and 32 of the temperature-sensing transistor section, and the temperature sense base pad 52 of the bias control ASIC 40 may be located adjacent to the RF input signal base pad 22 of the RF power transistor.

The temperature sense emitter pad 51 of the bias control ASIC is coupled to a first (−) input 61 of a first differential amplifier 60. A bias voltage source 41 (Vcc) is coupled through voltage dropping diodes 44 to the temperature sense base pad 52, which, as noted above, may be directly bonded to the base terminal pad 32 of the RF power transistor die 20. The ASIC's temperature sense base pad 51 (which is directly bonded to the base pad 31 of the temperature-sensing transistor section 10-T) is coupled to a second (+) input 62 of first differential amplifier 60.

Since the inputs to differential amplifier 60 are derived from the base-emitter junctions of the transistors of the temperature sensing transistor section 10-T, the output of differential amplifier 60 is representative of the base-emitter voltage Vbe of transistor 10-T, plus a small value of additional voltage that results from the flow of emitter current Ie through the degenerate emitter resistor 24T, namely the product of the emitter current sourced through the degenerate emitter resistor 24T to ground by programmable constant current source 50.

As noted above, with the processing conditions for forming all transistors on any given die are the same, any variation among transistors will be proportional to the ratios of their geometries. Using current lithography techniques, these ratios may be made equal to one-to-one, so that all transistor on the die are geometrically and dopant matched. In order to have each of the remaining transistor sections 10-1, . . . , 10-N of the die 20 track the temperature-compensated bias provided by temperature sense transistor set 10-T, the differential voltage produced at the output 63 of differential amplifier 60 may be directly coupled to output terminal pad 43 of bias control ASIC 40 for (direct wire bond) connection to the RF base input signal pad 22 of die 20.

ASIC 40 also includes a programmable D.C. offset voltage generator 80, which is employed to inject a programmed D.C. offset voltage into the temperature compensation path from the temperature-sensing transistor section 10-T to the RF input signal terminal pad 22 of the RF power transistor. This D.C. offset voltage is equivalent to the IR voltage drop across the emitter-degeneration resistor 24T, and serves to 'fine-tune' the effect of the temperature compensation transistor section 10-T, after the RF transistor architecture and the bias control ASIC have been fully characterized.

For this purpose, rather than directly connect the output 63 of differential amplifier 60 directly to ASIC output terminal pad 43, output 63 is connected to a first (+) input node 71 of a second differential amplifier 70. A second input node 72 of differential amplifier 70 is connected to receive the programmed D.C. offset voltage Vos generated by programmable voltage source 80. A bandwidth control element in the form of a capacitor 85 is shown as being connected across differential amplifier 70. However, it could be placed at another location in the control loop from the temperature offset sense transistor pads to the RF signal pad 32.

Programmable voltage source 80 may comprise a current-summing network, selected circuit segments of which are programmed through pads 83, to derive a desired binary-defined voltage offset, at an output current summing node 84 to which an amplifier input summing resistor is coupled. By applying a prescribed voltage to one or more of the pads 83, one or more respective fusible links are ruptured or 'blown', thereby programming the magnitude of binary-weighted current values which are summed at node 84 to establish the offset voltage Vos.

Alternatively, the offset voltage generator 80 may employ an internal voltage reference (derived from the supply voltage Vcc), which is coupled to a binary-weighted resistor ladder (not shown), thereby forming a binary weighted voltage divider. Connections to respective ones of the resistors are effected through externally accessible programming pads 83, to which the fusible links are coupled. By applying a prescribed voltage to one or more of the pads 83, one or more respective fusible links of the resistor ladder are ruptured or 'blown', thereby programming the magnitude of the binary-weighted voltage divider which establishes the magnitude of the offset voltage Vos.

The magnitude of the D.C. offset voltage programmed into voltage source 80 may be determined by measuring the collector current Ic under preliminary quiescent conditions of the RF power transistor and the temperature-sensing transistor section 10-T. The total collector current should be the product of the collector current for transistor set 10-T times the number (N) of remaining transistor sets in the die 20. Namely, the average transistor set collector current for the entire transistor set 10-1, . . . , 10-N should be the same as the collector current Ic for transistor set 10-T. Whatever D.C. offset voltage Vos is necessary to match these collector currents is the offset.

With generator 80 providing the necessary D.C. offset voltage, the output 73 of differential amplifier 70 will provide both a temperature compensated Vbe bias (supplied at the output 63 of differential amplifier 60) for setting the proper quiescent collector current for the entire RF power transistor set of die 20, as well as whatever D.C. offset voltage Vos is required to bring the total quiescent collector current of RF power transistor 10 to its exact value for the total number of its parallel-connected transistors sets 10-1, . . . , 10-N.

In accordance with a further aspect of the invention, the temperature compensation path from the temperature-compensation transistor section 10-T to the input RF signal pad 22 of the RF power transistor may be coupled to receive an externally generated control voltage, so as to allow the bias voltage to the RF power transistor to be adjusted in accordance with an externally generated modulation function, such as the envelope of the RF signal of interest, or other control signal, such as a separate DC voltage source. This externally generated bias or modulation control voltage may be applied as a further input to the first differential amplifier 60, or, where the second differential amplifier 70 is used to inject the programmed D.C. offset voltage into the temperature compensation path, as described above, this externally generate control voltage may be supplied as a further input to the second differential amplifier 70.

Alternatively, as diagrammatically illustrated in FIG. 1, the output of the second differential amplifier 70 may be coupled to a first (+) input 91 of a third differential amplifier 90. Differential amplifier 90 has a second (−) input 92 connected to an external control pad 94, to which the source of external bias or modulation may be applied. The output 93 of differential amplifier 90 is coupled through an RF filter shown as an LC circuit 87 to ASIC output pad 43 for connection to the RF input signal pad 22 of the RF power transistor.

As described above, in the first embodiment of the present invention, the temperature sense, bias control transistor 10-T occupies a dedicated portion of the array of parallel-connected transistors 10 within in the RF power transistor die 20 proper, so that sense transistor 10-T will precisely match the characteristics and operation of the RF power transistor components. Access to sense transistor 10-T thus requires connections between respective emitter and base sense terminal pads 31 and 32 of the die 10 and associated emitter and base terminal pads 51 and 52 of the ASIC 40.

In accordance with a second embodiment of the invention, for signal processing applications where the characteristics of the temperature-sensing device need not correspond precisely with those of the parallel-connected transistors of the RF power transistor, it is not necessary to integrate the temperature-compensation device into the RF transistor architecture, as in the first embodiment. Instead, the temperature-compensation device may be formed as part of the ASIC proper, rather than using a portion of the transistors of the RF power transistor die.

According to this second embodiment of the invention, the ASIC is configured to include an auxiliary temperature-sensing device, shown in broken lines 100-T in FIG. 1 as a diode-connected bipolar transistor QT, having its base and collector electrodes 112 and 113 tied in common to an auxiliary base sense pad 152, and its emitter electrode 111 connected to an auxiliary emitter sense pad 151. Substituting this auxiliary transistor 100-T for the integrated temperature-sensing transistor 10-T involves coupling pad 152 to pad 52 and pad 151 to pad 51, so that differential amplifier 60 is driven by the auxiliary transistor 100-T, rather than by the die-integrated transistor 10-T of the first embodiment.

Namely, the resultant bias voltage applied to the RF power transistor will be based upon the behavior of the ASIC-resident, auxiliary transistor 100-T, rather than a die-resident device (transistor section 10-T of the first embodiment). In the second embodiment, the collector current is primarily established by the D.C. offset voltage programmed into offset voltage generator 80, whereas the programmable bias current source 50 is employed to 'fine-tune' the temperature compensation, after the RF transistor and the bias control ASIC have been formed.

As noted earlier, installing the temperature-sensing device 100-T in the ASIC 40 simplifies the manufacture of the RF power transistor. The mask set for the die 10 need not be tailored for, nor provide separate connections to a temperature-sensing transistor set, and separate wiring steps for the sense base and sense emitter connections between the sense transistor and the ASIC are not required. However, it should be realized that optimum sensitivity and performance is achieved by integrating the temperature-sensing, bias control device as a dedicated transistor section of the RF power transistor die 20, as in the first embodiment of the invention, thereby ensuring that the behavior of the temperature-sensing transistor will precisely match that of the RF power transistor.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A circuit arrangement for setting collector current bias for an RF power transistor comprising a bias control circuit that is coupled with a collector-emitter current flow path of a temperature-sensing transistor resident in a common support structure for said RF power transistor, said bias control circuit being operative to establish a prescribed quiescent collector current through said temperature-sensing transistor, and wherein a base bias for said RF power transistor is derived in accordance with a differential voltage across the base and the emitter electrodes of said temperature-sensing transistor, thereby providing a collector current through said RF power transistor in accordance with operation of said temperature-sensing transistor.

2. A circuit arrangement according to claim 1, wherein said RF power transistor comprises a transistor architecture configured of a plurality of parallel-connected transistors formed in a semiconductor die, and wherein said temperature-sensing transistor has the same transistor structure as respective ones of said plurality of parallel-connected transistors and is integrated together with said plurality of parallel-connected transistors in said semiconductor die.

3. A circuit arrangement according to claim 1, wherein said temperature-sensing transistor is contained within said bias control circuit.

4. A circuit arrangement according to claim 2, wherein said bias control circuit comprises a constant current source coupled in circuit with the collector-emitter current flow path of said temperature-sensing transistor.

5. A circuit arrangement according to claim 4, wherein said constant current source is programmable.

6. A circuit arrangement according to claim 4, wherein said bias control circuit further includes a D.C. offset voltage generator which is operative to generate a D.C. offset voltage that is coupled to bias the base electrodes of said plurality of parallel-connected transistors.

7. A circuit arrangement according to claim 6, wherein said D.C. offset voltage generator is programmable.

8. A circuit arrangement according to claim 2, wherein said bias control circuit comprises a constant current source, which is coupled in circuit with the collector-emitter current flow path of said temperature-sensing transistor and is operative to cause the flow of said prescribed quiescent collector current through said temperature-sensing transistor, and a differential amplifier circuit, coupled to base and emitter electrodes of said temperature-sensing transistor and being operative to apply a biasing voltage to the base electrodes of said plurality of parallel-connected transistors of said RF power transistor, so as to set quiescent collector currents therethrough in accordance with the differential voltage across said base and emitter electrodes of said temperature-sensing transistor.

9. A circuit arrangement according to claim 8, wherein said differential amplifier circuit is operative to combine the differential voltage across the base and emitter of said temperature-sensing transistor with an external control voltage, and produce therefrom said bias voltage that is applied to the base electrodes of said plurality of parallel-connected transistors of said RF power transistor.

10. A circuit arrangement according to claim 8, wherein said differential amplifier circuit is operative to combine the differential voltage across at the base and emitter of said temperature-sensing transistor with a predetermined D.C. offset voltage, and produces therefrom said bias voltage that biases the base electrodes of said plurality of parallel-connected transistors, such that the average of quiescent collector currents therethrough corresponds to said prescribed quiescent collector current through said RF power transistor.

11. A circuit arrangement according to claim 10, wherein said differential amplifier circuit is operative to combine the differential voltage across at the base and emitter of said temperature-sensing transistor and said predetermined D.C. offset voltage with an external control voltage, and producing therefrom said bias voltage that biases the base electrodes of said plurality of parallel-connected transistors of said RF power transistor.

12. A circuit arrangement according to claim 1, wherein said RF power transistor comprises a class A/B power amplifier transistor.

13. A circuit arrangement according to claim 2, wherein said bias control circuit is configured as an application specific integrated circuit installed on a common substrate supporting said semiconductor die containing said RF power transistor.

14. A circuit arrangement according to claim 2, wherein said temperature-sensing transistor and said plurality of parallel-connected transistors are effectively geometrically matched.

15. A method of setting base and emitter bias conditions for an RF power transistor, so as to establish a quiescent bias collector current therefor, said RF power transistor being configured of a plurality of parallel-connected transistors in a semiconductor die, said method comprising the steps of:
(a) coupling a temperature-sensing transistor in circuit with a constant current source which is operative to cause the flow of a prescribed quiescent collector current through said temperature-sensing transistor; and
(b) biasing the base electrodes of said plurality of parallel-connected transistors of said RF power transistor in accordance with a differential voltage across said base and emitter electrodes of said temperature-sensing transistor.

16. A method according to claim 15, wherein said RF power transistor comprises a class A/B power amplifier transistor.

17. A method according to claim 15, wherein step (b) comprises biasing the base electrodes of said plurality of parallel-connected transistors in accordance with a combination of the differential voltage across said base and emitter electrodes of said temperature-sensing transistor and a D.C. offset voltage, such that the average of quiescent collector currents through said plurality of parallel-connected transistors effectively corresponds to said prescribed quiescent collector current through said temperature-compensation transistor.

18. A method according to claim 17, wherein step (b) further comprises combining the differential voltage across the base and emitter electrodes of said temperature-sensing transistor and said D.C. offset voltage with an external control voltage, and producing therefrom a composite bias voltage which biases base electrodes of said plurality of parallel-connected transistors.

19. A method according to claim 15, wherein said temperature-sensing transistor is resident in said semiconductor die with said RF power transistor.

20. A method according to claim 19, wherein said temperature-sensing transistor and said plurality of parallel-connected transistors are effectively geometrically matched.

21. A method according to claim 15, wherein said temperature-sensing transistor is external to said semiconductor die.

22. A method arrangement according to claim 18, wherein said constant current source is programmable, and the magnitude of current generated by said programmable current source is determined by measuring the collector current under preliminary quiescent conditions of the RF power transistor and said temperature-sensing transistor, and programming said constant current source such that the average transistor collector current for said RF power transistor is the same as the collector current through said temperature-sensing transistor.

23. A method according to claim 22, wherein step (b) comprises biasing the base electrodes of said plurality of parallel-connected transistors of said RF power transistor in accordance with a programmable D.C. offset voltage, the magnitude of which is set to adjust the collector current through said temperature-sensing transistor after circuit characteristics of said RF power transistor and said temperature-sensing transistor have been established.

24. A method according to claim 21, wherein step (b) comprises biasing the base electrodes of said plurality of parallel-connected transistors of said RF power transistor in accordance with a D.C. offset voltage.

25. A method according to claim 24, wherein said D.C. offset voltage is programmable.

26. A method arrangement according to claim 25, wherein the magnitude of D.C. offset voltage is determined by measuring the collector current under preliminary quiescent conditions of the RF power transistor and said temperature-sensing transistor, and programming said D.C. offset voltage such that the average transistor collector current for said RF power transistor is the same as the collector current through said temperature-sensing transistor.

27. A method arrangement according to claim 26, wherein said constant current source is programmable, and the magnitude of current generated by said programmable current source is set to adjust the collector current through said temperature-sensing transistor after circuit characteristics of said RF power transistor and said temperature-sensing transistor have been established.

28. A circuit arrangement for setting quiescent bias conditions for an RF power transistor comprising a temperature-sensing transistor resident in a common support structure for said RF power transistor, and a bias control circuit that is coupled to supply a constant current through the emitter-collector flow path of said temperature-sensing transistor and to bias said RF power transistor in accordance with the differential voltage developed across the base and emitter of said temperature-sensing transistor as a result of the flow of said constant current through said emitter-collector flow path of said temperature-sensing transistor.

29. A circuit arrangement according to claim 28, wherein said RF power transistor comprises a transistor architecture configured of a plurality of parallel-connected transistors formed in a semiconductor die, and wherein said temperature-sensing transistor has the same transistor structure as respective ones of said plurality of parallel-connected transistors and is integrated together with said plurality of parallel-connected transistors in said semiconductor die.

30. A circuit arrangement according to claim 28, wherein said RF power transistor comprises a transistor architecture configured of a plurality of parallel-connected transistors formed in a semiconductor die, and wherein said temperature-sensing transistor is contained within said bias control circuit external of said semiconductor die.

31. A circuit arrangement according to claim 28, wherein said constant current source is programmable.

32. A circuit arrangement according to claim 28, wherein said RF power transistor comprises a transistor architecture configured of a plurality of parallel-connected transistors formed in a semiconductor die, and wherein said bias control circuit further includes a programmable D.C. offset voltage generator which is operative to apply a programmable D.C. offset voltage to the base-emitter electrodes of said plurality of parallel-connected transistors.

33. A circuit arrangement according to claim 32, wherein said bias control circuit is configured to combine the differential voltage across the base and emitter of said temperature-sensing transistor and said programmable D.C. offset voltage with an external control voltage, and produces therefrom a bias voltage that is applied to the base electrodes of said plurality of parallel-connected transistors of said RF power transistor.

34. A circuit arrangement according to claim 28 wherein said RF power transistor comprises a class A/B power amplifier transistor.

35. A circuit arrangement according to claim 28, wherein said bias control circuit is configured as an application specific integrated circuit installed on a common substrate supporting said RF power transistor.

* * * * *